(12) United States Patent
Hofmann et al.

(10) Patent No.: US 7,335,939 B2
(45) Date of Patent: Feb. 26, 2008

(54) SEMICONDUCTOR MEMORY DEVICE AND METHOD OF PRODUCTION

(75) Inventors: Franz Hofmann, München (DE);
Johannes Luyken, München (DE);
Michael Specht, München (DE)

(73) Assignee: Infineon Technologies AG, Munich (DE)

( * ) Notice: Subject to any disclaimer, the term of this patent is extended or adjusted under 35 U.S.C. 154(b) by 337 days.

(21) Appl. No.: 11/135,002

(22) Filed: May 23, 2005

(65) Prior Publication Data

US 2006/0261403 A1    Nov. 23, 2006

(51) Int. Cl.
*H01L 29/76* (2006.01)
(52) U.S. Cl. .................. 257/314; 257/324; 257/401; 257/E21.679
(58) Field of Classification Search ................ 257/324, 257/314, E21.679
See application file for complete search history.

(56) References Cited

U.S. PATENT DOCUMENTS 6,184,548 B1 *  2/2001  Chi et al. .................. 257/301

2004/0232515 A1  11/2004  Mori et al.
2005/0032311 A1  2/2005  Hofmann et al.

FOREIGN PATENT DOCUMENTS

DE     102 04 873 C1   10/2003
WO   WO 2004/003979 A2    1/2004

OTHER PUBLICATIONS

Eitan, B., et al., "NROM: A Novel Localized Trapping, 2-Bit Nonvolatile Memory Cell," IEEE Electron Device Letters, vol. 21, No. 11, Nov. 2000, pp. 543-545.

* cited by examiner

*Primary Examiner*—Jerome Jackson
*Assistant Examiner*—José R. Diaz
(74) *Attorney, Agent, or Firm*—Slater & Matsil, L.L.P.

(57) ABSTRACT

An array of charge-trapping memory cells and pluralities of parallel wordlines and parallel bitlines running transversely to the wordlines are arranged on a substrate surface. Gate electrodes are located between the wordlines and bitlines and are, in their sequence along the direction of the wordlines, connected alternatingly to one of two adjacent wordlines.

9 Claims, 5 Drawing Sheets

SEMICONDUCTOR MEMORY DEVICE AND METHOD OF PRODUCTION

TECHNICAL FIELD

This invention concerns semiconductor memory devices, which are especially suited for NROM-memories and an appertaining production method.

BACKGROUND

Non-volatile memory cells that are electrically programmable and erasable can be realized as charge-trapping memory cells, which comprise a memory layer sequence of dielectric materials. In the layer sequence, a memory layer is arranged between confinement layers that have a larger energy band gap than the memory layer. The memory layer sequence is arranged between a channel region that is located within a semiconductor body and a gate electrode that is arranged above the channel region and is provided to control the channel by means of an applied electric voltage. Charge carriers moving from source to a drain through the channel region are accelerated and gain enough energy to be able to pass the lower confinement layer and to be trapped in the memory layer. The trapped charge carriers change the threshold voltage of the cell transistor structure. Different programming states can be read by applying the appropriate reading voltages. Examples of charge-trapping memory cells are the SONOS memory cells, in which each confinement layer is an oxide and the memory layer is a nitride of the semiconductor material, usually silicon.

A publication by B. Eitan et al., "NROM: a Novel Localized Trapping, 2-Bit Nonvolatile Memory Cell" in IEEE Electron Device Letters, volume 21, pages 543 to 545 (2000), which is incorporated herein by reference, describes a charge-trapping memory cell with a memory layer sequence of oxide, nitride and oxide, which is especially adapted to be operated with a reading voltage that is reverse to the programming voltage (reverse read). The oxide-nitride-oxide layer sequence is especially designed to avoid the direct tunneling regime and to guarantee the vertical retention of the trapped charge carriers. The oxide layers are specified to have a thickness of more than 5 nm. Two bits of information can be stored in every memory cell.

Typical applications of memory products require a steady miniaturization of the memory cells. A reduction of the area that is required by an individual memory cell can be obtained by shrinking the cell structure or by an increase of the number of bits that can be stored within one memory cell transistor structure. The area of memory cell arrays can be reduced if the memory cell transistors are arranged in trenches that are formed at the surface of the semiconductor substrate. Such an arrangement renders U-shaped transistor channels, which comprise a much larger channel length than planar transistors. This is especially favorable in the case of charge-trapping memory cells described above.

The programming of charge-trapping memory cells is effected with relatively high drain-gate voltages. A punch-through between source and drain is avoided by the sufficiently large channel length. On the other hand, a punch-through can also occur between neighboring cell transistors. This limits the possible minimum pitch of the memory cell arrangement. A further problem is the injection of avalanche hot electrons into the memory layer of the adjacent cell transistor. This is due to the fact that the programming takes place while a high voltage is applied also to the wordlines of both neighboring transistors.

SUMMARY OF THE INVENTION

In one aspect, the present invention aims at an improvement of a memory cell array comprising U-type cell transistors, in order to avoid an undesired programming of neighboring cell transistors.

In a further aspect, the invention concerns a production method that is adapted to the production of the memory devices according to this invention.

The memory cell array of the memory device according to this invention comprises a layout in which different wordline voltages are applied to neighboring cell transistors in the course of programming. The electric connections of the layout are produced by a sequence of especially adapted method steps.

In one embodiment, the semiconductor memory device includes a semiconductor substrate with a main surface, an array of memory cells that are arranged in rows and columns on the surface, wordlines that are arranged parallel and at a distance from one another along the rows and bitlines that are arranged parallel and at a distance from one another along the columns transversely to the wordlines. Each memory cell includes source/drain regions that are located at the main surface, a gate electrode that is arranged in a recess of the surface between source and drain, a gate dielectric that is arranged between the gate electrode and the substrate, and a memory layer that is present at least between the gate electrode and the source/drain regions. Gate interconnects are provided to electrically couple each of the gate electrodes to one of two adjacent wordlines. These electrical connections are arranged in a fashion that, in their sequence along each row, the gate electrodes are subsequently coupled alternatingly to one of the adjacent wordlines.

A method for production of the semiconductor memory device comprises the steps of providing a semiconductor substrate having a main surface; etching into the surface to form trenches that are parallel and at a distance from one another; filling the trenches with electrically insulating material to form insulating regions; applying at least one electrically conductive wordline layer and a top wordline insulation, which are structured to form wordlines; applying spacers of dielectric material to form lateral wordline insulations; performing an implantation of a dopant to form source/drain regions self-aligned to the wordlines; applying at least one electrically conductive bitline layer and a top bitline insulation, which are structured to form bitlines transverse to the wordlines; applying spacers of dielectric material to form lateral gate insulations; etching recesses between the wordlines and the bitlines into the main surface; applying a gate dielectric comprising a memory layer on surfaces within the recesses; depositing electrically conductive material provided for gate electrodes into the recesses; applying a cover layer of electrically insulating material into spaces between the bitlines; forming openings in the cover layer in regions each of which encompass at least a partial area of an upper surface of one of the gate electrodes and at least a partial area of an upper surface of an electrically conductive wordline layer of an adjacent wordline; and filling the openings with electrically conductive material to form gate interconnects that contact the upper surfaces, the openings being arranged in a fashion so that gate electrodes succeeding each other in the direction of the wordlines are alternatingly connected to one of two adjacent wordlines by the gate interconnects.

These and other features and advantages of the invention will become apparent from the following brief description of the drawings, detailed description and appended claims and drawings.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
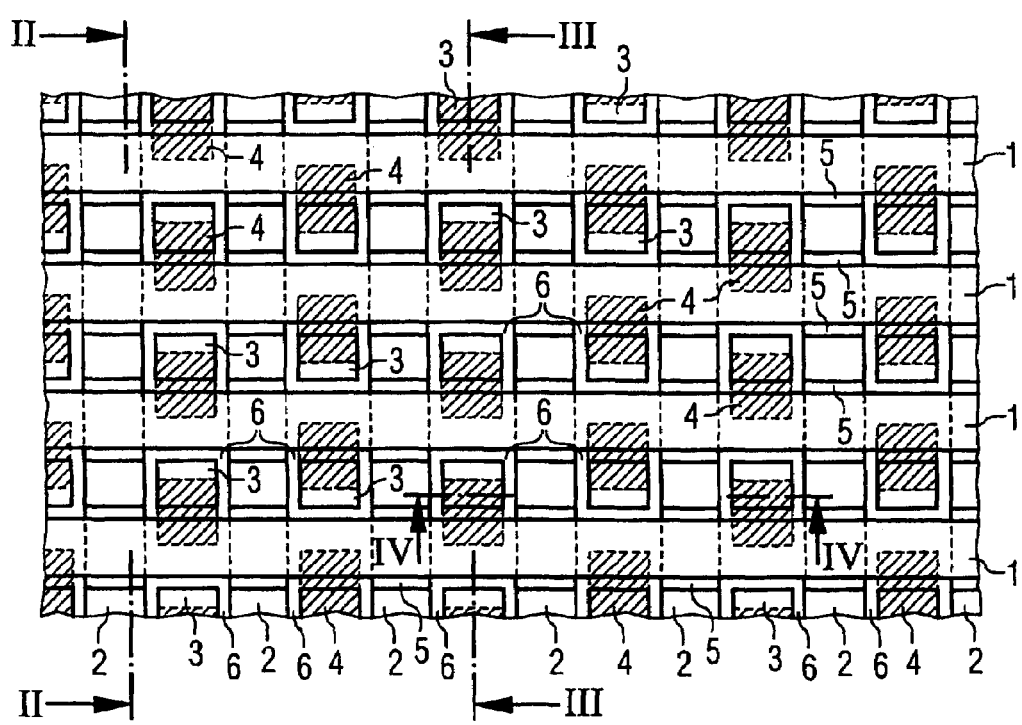
FIG. 1 shows a plan cross-section through a preferred embodiment of the memory device.

The following list of reference symbols can be used in conjunction with the figures:
1 wordline
2 bitline
3 gate electrode
4 gate interconnect
5 lateral wordline insulation
6 lateral gate insulation
7 substrate
8 insulating region
9 hard mask layer
10 first wordline layer
11 second wordline layer
12 top wordline insulation
13 source/drain region
14 first bitline layer
15 second bitline layer
16 top bitline insulation
17 recess
18 memory layer
19 lower cover layer
20 upper cover layer

DETAILED DESCRIPTION OF ILLUSTRATIVE EMBODIMENTS

FIG. 1 shows a plan cross-section of a preferred embodiment of the memory device. The wordlines 1 are arranged parallel at a distance from one another in the direction of rows of memory cells. The bitlines 2 run transversely to the wordlines along the columns of the memory cell array, parallel and at a distance from one another. Since only the lower parts of the bitlines 2 belong to the cross-section of FIG. 1, the arrangement of the bitlines is shown with broken lines as concealed contours. The concealed sections of the bitlines are located in superior layer levels of the device, behind the drawing plane of FIG. 1.

Above the level of the cross-section of FIG. 1, there are also the gate interconnects 4, which are indicated by hatched areas, which are surrounded by broken lines. The hatching merely serves to highlight these areas and to help to better distinguish them from the other details of the drawing. Thus, it can be clearly seen that the gate interconnects 4 are arranged partly above the wordlines 1 and partly above areas that are located between the wordlines and between the bitlines. In these intermediate areas, there are arranged the gate electrodes 3, which are surrounded by lateral gate insulations 6. The lateral wordline insulations 5 and the lateral gate insulations 6 electrically insulate the wordlines, the bitlines, and the gate electrodes from each other.

FIG. 1 shows a further essential feature of the inventive device. The gate interconnects 4 are arranged in such a manner that, along each row of memory cells, the gate electrodes are subsequently coupled alternatingly to one of the adjacent wordlines. The application of the gate interconnects 4 on upper surfaces of the wordlines and the gate electrodes is the preferred arrangement and the most suitable means to obtain the described scheme of connections.

Figure 2:
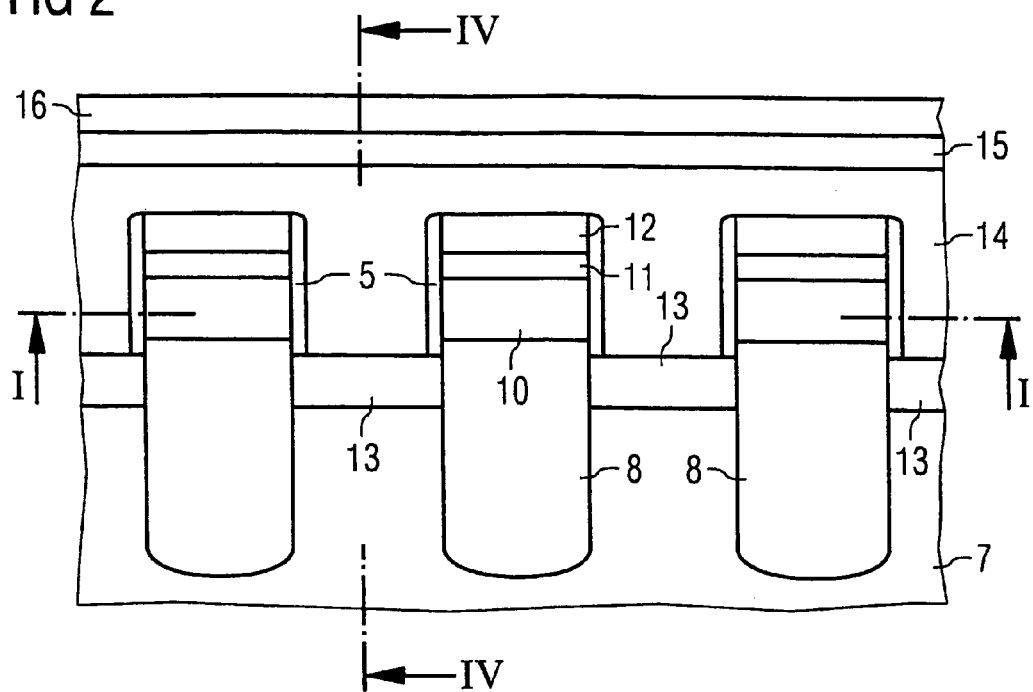
FIG. 2 shows the first cross-section indicated in FIG. 1 along a bitline of the embodiment of FIG. 1.

FIG. 2 shows the first cross-section indicated in FIG. 1 along one of the bitlines. A substrate 7 of semiconductor material is provided with insulating regions 8, which are arranged as parallel strips in the semiconductor body beneath the wordlines. The wordlines preferably comprise at least a first wordline layer 10, which may be electrically conductively doped polysilicon, and a second wordline layer 11, which reduces the track resistance and may be formed of tungsten silicide. The wordline is embedded in electrically insulating material, which is formed by lateral wordline insulations 5, which are applied as sidewall spacers, and by top wordline insulations 12. The lateral wordline insulations 5 and the top wordline insulations 12 can be, for example, silicon nitride or silicon oxide. Between the striplike insulation regions 8, upper layers of the substrate 7 are doped to form source/drain regions 13.

The bitlines are arranged transversely across the wordlines. The bitlines preferably comprise at least a first bitline layer 14, for example doped polysilicon, a second bitline layer 15, for example tungsten silicide, and a top bitline insulation 16, for example silicon nitride. Other suicides such as cobalt silicide, nickel silicide and titanium silicide could also be used for the second bitline layer 15. The first bitline layer 14 is applied on the source/drain regions 13 to form source/drain contacts.

Figure 3:
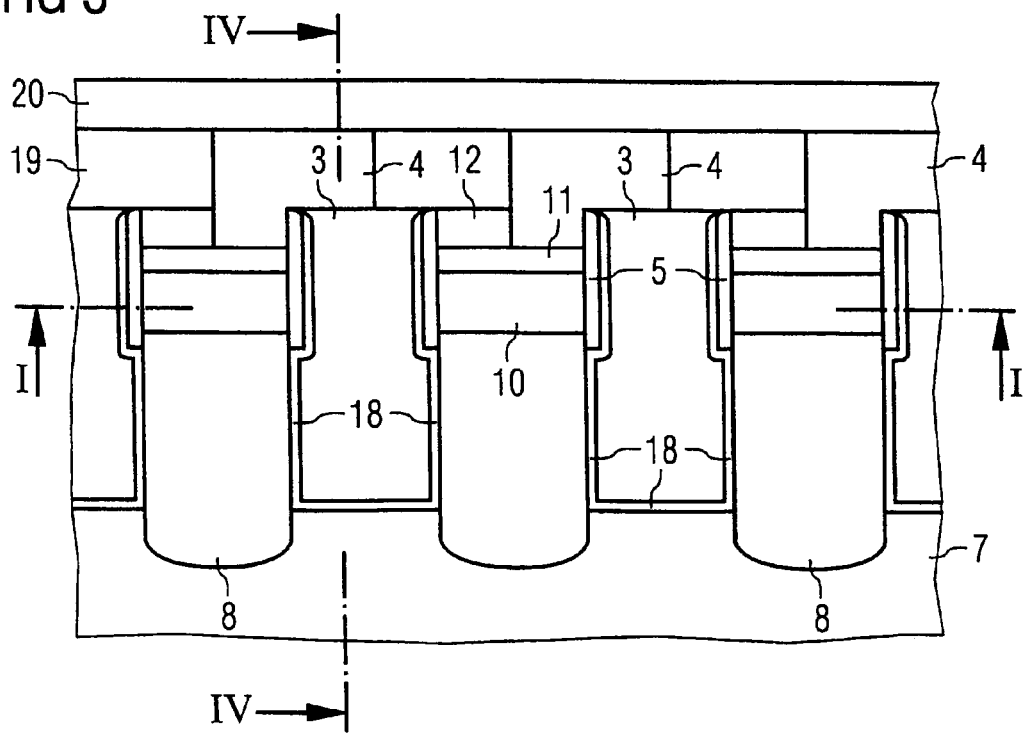
FIG. 3 shows the second cross-section indicated in FIG. 1 between neighboring bitlines.

FIG. 3 shows the second cross-section indicated in FIG. 1 coplanar to the cross-section of FIG. 2, but located between two neighboring bitlines. The substrate 7, the insulating regions 8, the wordlines, and the lateral wordline insulations 5 are shown in this cross-section with the same shapes as in FIG. 2. The source/drain regions are only present beneath the bitlines. In the cross-section according to FIG. 3, the spaces between the wordlines are occupied by the gate electrodes 3, which reach down into the regions between the insulating regions 8. The gate electrodes 3 are electrically insulated from the semiconductor material by a gate dielectric, which separates the gate electrodes from the source/drain regions, which are located in front of and behind the drawing plane. Preferably, the gate dielectric is formed of a memory layer 18, preferably a memory layer sequence of different dielectric materials, comprising a material that is suitable for charge-trapping. It may especially be an oxide-nitride-oxide layer sequence. The memory layer 18 can completely surround the gate electrodes 3 laterally and at the bottom, and thus form an additional insulation from the wordlines, as is shown in FIG. 3.

The gate interconnects 4 are arranged in recesses of the top wordline insulation 12 and contact the uppermost electrically conductive layer of the wordlines, in this example the second wordline layer 11. The gate interconnects 4 contact at least a partial area of the upper surface of the neighboring gate electrode 3. In this manner, the gate electrodes 3 are electrically connected to the adjacent wordlines. This arrangement of the gate electrodes, the wordlines, and the gate interconnects enables the realization of the desired interconnection scheme according to FIG. 1. The gate interconnects 4 are arranged in a lower cover layer 19 of dielectric material, for example silicon oxide, and are thus laterally surrounded by an insulation. An upper cover layer 20, shown in FIG. 3, planarizes the structure up to the level of the top bitline insulation 16.

Figure 4:
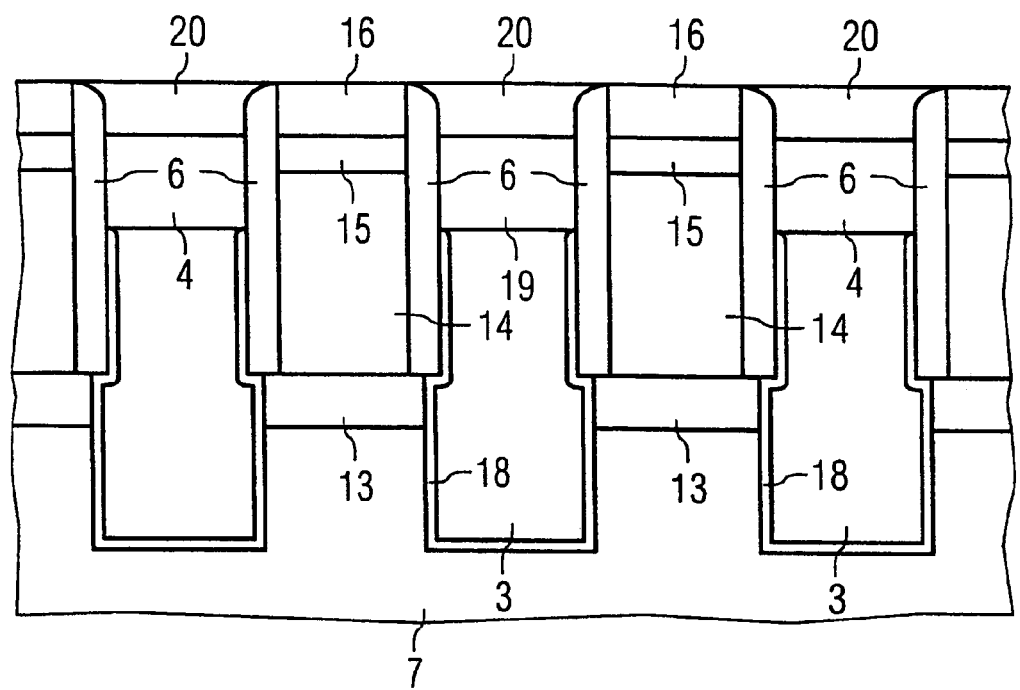
FIG. 4 shows the third cross-section indicated in FIG. 1 normal to the cross-sections of FIGS. 2 and 3.

FIG. 4 shows the third cross-section indicated in FIG. 1, which runs transversely to the cross-sections according to FIGS. 2 and 3. Therefore, FIG. 4 shows the bitlines, which are formed of first and second bitline layers 14, 15 in this embodiment, and the gate electrodes 3, as well as the relative position of the source/drain regions below the bitlines and the gate electrodes 3. The location of the memory layer 18, which is applied at least in the regions of the boundaries between the source/drain regions 13 and the gate electrodes 3, covers the gate electrodes 3 laterally and at the bottom in this embodiment. The plane of the cross-section is chosen so that the alternating arrangement of the gate interconnects 4 is illustrated in the cross-section of FIG. 4, which intersects every second gate interconnect 4, while the gate electrodes situated in between are covered with the lower cover layer 19. Here, the gate electrode 3 in the middle of the drawing of FIG. 4 is covered with the lower cover layer 19, whereas the next gate electrodes to the left and to the right are contacted with gate interconnects 4. A comparison with FIG. 1 shows that the gate interconnect of the middle electrode in FIG. 4 is situated behind the drawing plane.

The lateral gate insulations 6 are applied with sufficient thickness to secure the necessary electric insulation between the bitlines and the adjacent gate electrodes. The arrangement and structure of the gate dielectric can be different in different embodiments. It is sufficient if a memory layer sequence provided for charge-trapping is present at the locations of the programmed bits adjacent to the source/drain regions of each memory cell. Dielectric material separates the gate electrodes from the semiconductor material. The channel regions of the cell transistors are situated at the semiconductor surfaces opposite to the gate electrodes, the channels extending between two neighboring source/drain regions along the boundaries of the recesses in which the gate electrodes are arranged. A preferred embodiment of a charge-trapping memory cell comprises a gate dielectric that is formed as a memory layer sequence of dielectric materials and is arranged around the gate electrodes in the manner shown in the figures.

Figure 5:
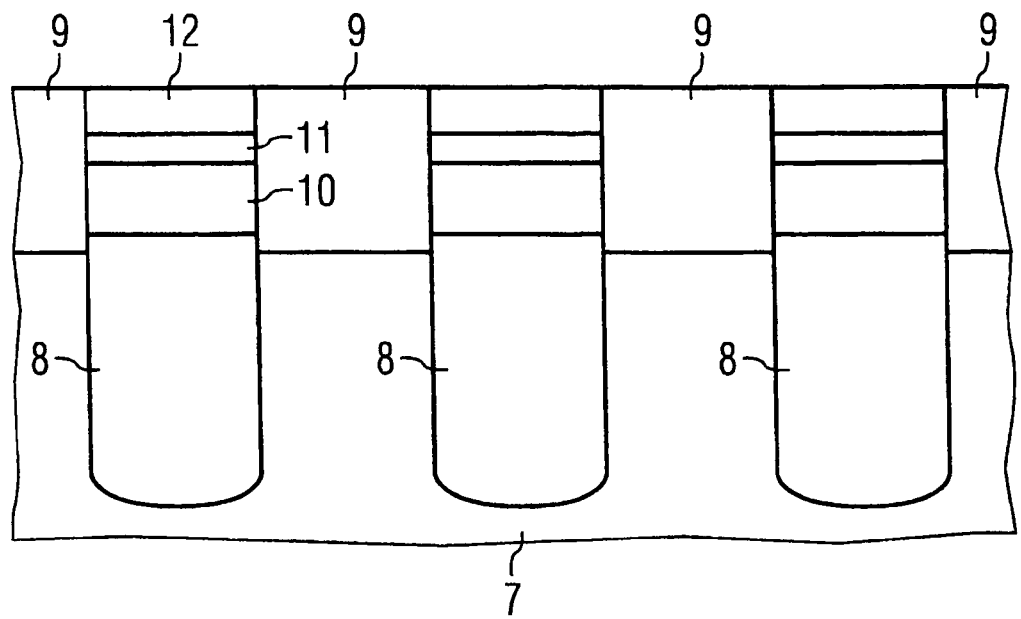
FIG. 5 shows a cross-section according to FIGS. 2 and 3 of a first intermediate product of a preferred production method.

An especially adapted production method of this memory device is described in the following, referring to FIGS. 5 to 8. FIG. 5 shows a cross-section of an intermediate product in a section plane corresponding to the cross-sections of FIG. 2 or 3. A material that is suitable to form a hard mask, for example nitride (e.g., silicon nitride), is applied to a main upper surface of a semiconductor substrate. This hard mask layer 9 is structured by means of a photolithography. Using the structured layer as a mask, trenches running parallel to one another and at a distance from one another are etched into the main surface of the substrate. Eventually remaining parts of a resist layer used in the photolithography step are then removed. An electrically insulating material, for example silicon oxide, is deposited into the trenches to form the insulating regions 8. The upper surface is planarized, preferably by chemical mechanical polishing, and the material is etched back to form the insulating regions as shown in FIG. 5. Then, the wordlines are produced by the application of at least one electrically conductive wordline layer. In the example that is described here, first wordline layers 10 are produced by a deposition of electrically conductively doped polysilicon into the openings of the hard mask layer 9. The deposited material is then planarized and re-etched to form the first wordline layers 10. Second wordline layers 11 can be applied in a corresponding manner in order to reduce the track resistance of the first wordline layers 10. The second wordline layers 11 may comprise, for example, a silicide such as tungsten silicide. Other silicides such as cobalt silicide, nickel silicide and titanium silicide could also be used. The wordlines are covered with a top wordline insulation 12, which may be nitride or, preferably, oxide. After a planarization of the surface, the hard mask layer 9 is removed.

Figure 6:
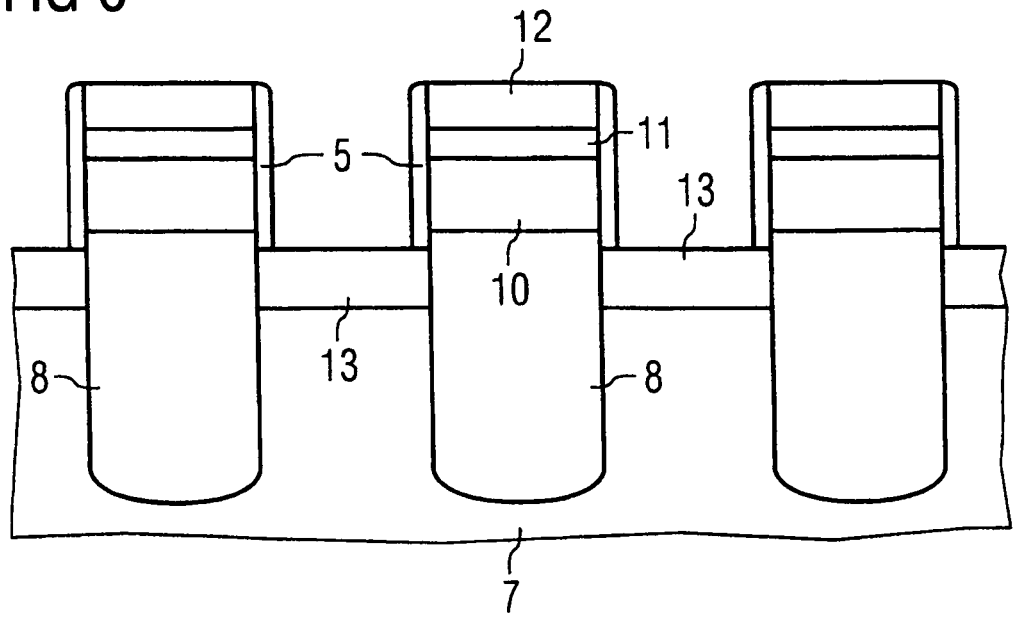
FIG. 6 shows the cross-section according to FIG. 5 of a second intermediate product.

FIG. 6 shows a further intermediate product in a cross-section according to FIG. 5. Lateral wordline insulations 5 are formed of an electrically insulating material, for example nitride, and are preferably applied as sidewall spacers. The spacers are produced by method steps that are known, for example, by a conformal deposition of a layer of the spacer material and a subsequent anisotropic etching step to reduce this layer to the sidewall spacers shown in FIG. 6. The source/drain regions 13 are then formed by an implantation of a dopant in an upper layer of the substrate 7. The bitlines are then produced by a deposition of at least one electrically conductive layer. As in the case of the wordlines, a first bitline layer 14 (shown in FIG. 2) may comprise doped polysilicon and an optional second bitline layer of tungsten silicide. A top bitline insulation can be formed of silicon nitride. After the deposition of each layer, they are preferably planarized by chemical mechanical polishing and etched back to the appropriate layer thicknesses. The layer sequence provided for the bitlines is then structured by another photolithography step to form bitline stacks running transversely across the wordlines and contacting the source/drain regions 13 between adjacent wordlines. Remaining parts of the photo resist are removed so that the structure according to the cross-section of FIG. 2 is obtained. It is preferred to perform a subsequent process step by which the parts of the lateral wordline insulations 5 (of nitride in this example) that are not covered by the bitlines are removed before the lateral gate insulation 6 is applied. The lateral gate insulation 6 can be formed as sidewall spacers, preferably of silicon nitride, in the same way as the lateral wordline insulations 5.

Figure 7:
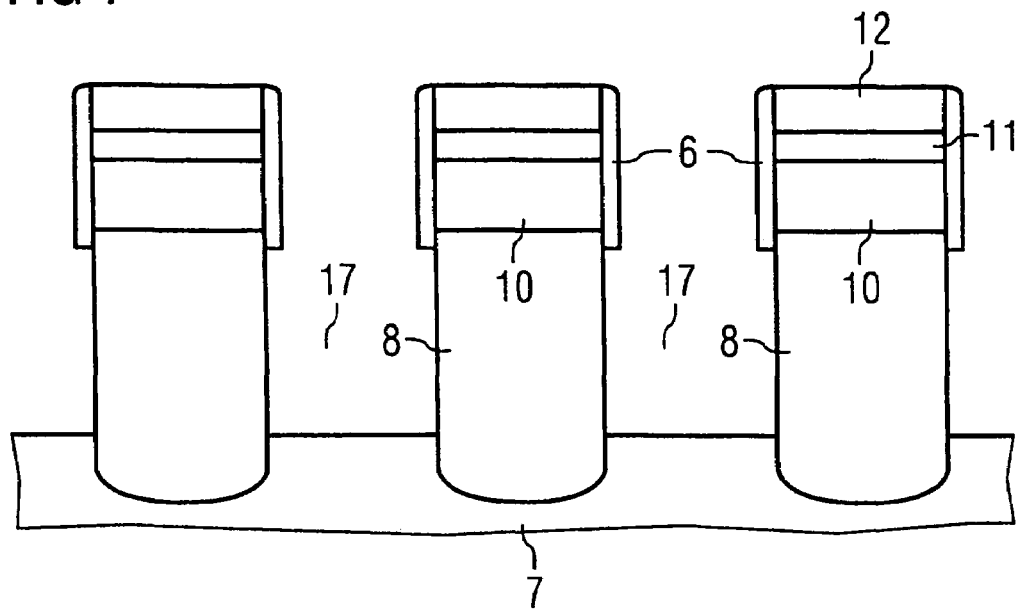
FIG. 7 shows the cross-section according to FIG. 6 of a third intermediate product.

FIG. 7 shows a further intermediate product in a cross-section according to FIG. 3. Between the wordlines and between the bitlines, the semiconductor material of the substrate 7 is etched out to form recesses 17. These recesses can be etched straight down into the substrate and afterwards be laterally widened to remove the semiconductor material also below the lateral gate insulations 6. Then, the gate dielectric is applied on the surfaces of the recesses 17. The gate dielectric is preferably formed as a memory layer, including a layer that is suitable for charge-trapping. A lower confinement layer of a memory layer sequence can be produced by an oxidation of the semiconductor surfaces within the recesses 17, corresponding to a standard formation of gate dielectrics. Then, the charge-trapping layer, which may be nitride, is applied at least in the vicinity of the source/drain regions. An upper confinement layer of the memory layer sequence can be produced by a deposition of a high temperature oxide.

Figure 8:
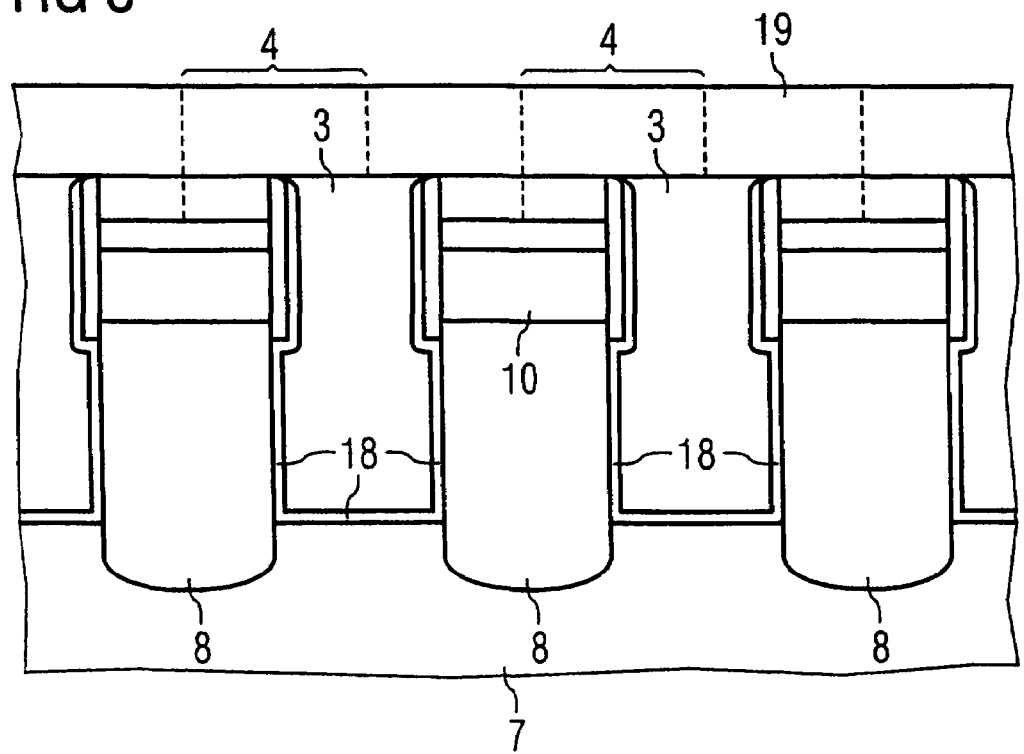
FIG. 8 shows the cross-section according to FIG. 7 after the formation of the gate electrodes.

FIG. 8 shows a further intermediate product, obtained after following process steps, in a cross-section according to FIG. 7. After the production of the memory layer 18, for instance a memory layer sequence as described above, the recesses have been filled with the material provided for the gate electrodes 3. This can be electrically conductively doped polysilicon. The deposited material is etched back as necessary. Thus, the spaces between the bitlines and wordlines are filled with the gate electrode material as shown in FIG. 8. Then, a lower cover layer 19, for example oxide, is deposited and planarized by chemical mechanical polishing. A further photolithography step takes place, by which the lower cover layer 19 is structured with openings in those regions where the gate interconnects 4 are to be formed. These regions are indicated with broken lines in FIG. 8. Remaining parts of the photo resist are removed, and the material provided for the gate interconnects 4, for example doped polysilicon, is deposited into the openings. FIG. 8 shows that an area of the top wordline insulation 12 is also removed so that the gate interconnects 4 are applied to the uppermost electrically conductive layers of the wordlines and make contact with these layers. After the planarization of the surface, an upper cover layer 20, according to FIG. 3, can be deposited to equalize the upper levels of the device. In this way, the device structure according to FIGS. 1 to 4 can be produced.

Although the present invention and its advantages have been described in detail, it should be understood that various changes, substitutions and alterations can be made herein without departing from the spirit and scope of the invention as defined by the appended claims.

What is claimed is:

1. A semiconductor memory device comprising:
    a semiconductor substrate with a main surface;
    an array of memory cells that are arranged in rows and columns at said main surface;
    wordlines that are arranged parallel and at a distance from one another along said rows;
    bitlines that are arranged parallel and at a distance from one another along said columns transversely to said wordlines;
    each of said memory cells comprising source/drain regions that are located at said main surface, a gate electrode that is arranged in a recess of said main surface between said source/drain regions, a gate dielectric that is arranged between said gate electrode and said substrate, and a memory layer that is present at least between said gate electrode and said source/drain regions; and
    gate interconnects being provided to electrically connect each of said gate electrodes to one of two adjacent ones of said wordlines, wherein electrical connection of said gate electrodes and said wordlines by said gate interconnects is arranged in a fashion that, along each of said rows, said gate electrodes are subsequently coupled alternatingly to one of said two adjacent wordlines.

2. The semiconductor memory device according to claim 1, wherein said gate interconnects are arranged on upper surfaces of said gate electrodes and said wordlines.

3. The semiconductor memory device according to claim 1, wherein said memory layer comprises a memory layer sequence of dielectric materials suitable for charge-trapping.

4. The semiconductor memory device according to claim 3, wherein said memory layer comprises a silicon nitride layer sandwiched between two oxide layers.

5. The semiconductor memory device according to claim 1, wherein:
    said bitlines are arranged above said wordlines; and
    said gate electrodes and said gate interconnects are arranged between said bitlines.

6. The semiconductor memory device according to claim 1, wherein the bitlines each comprise a first bitline layer, a second bitline layer over the first bitline layer and a top bitline insulation over the second bitline layer.

7. The semiconductor memory device according to claim 6, wherein the first bitline layer comprises a doped polysilicon layer, the second bitline layer comprises a silicide layer, and the top bitline insulation comprises a silicon nitride layer.

8. The semiconductor memory device according to claim 1, wherein the wordlines each comprise polysilicon and a silicide.

9. The semiconductor memory device according to claim 8, wherein the silicide comprises tungsten silicide.

* * * * *